(12) United States Patent
Okuno

(10) Patent No.: US 8,367,445 B2
(45) Date of Patent: Feb. 5, 2013

(54) GROUP III NITRIDE SEMICONDUCTOR LIGHT-EMITTING DEVICE

(75) Inventor: Koji Okuno, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 0 days.

(21) Appl. No.: 13/304,050

(22) Filed: Nov. 23, 2011

(65) Prior Publication Data

US 2012/0135557 A1 May 31, 2012

(30) Foreign Application Priority Data

Nov. 25, 2010 (JP) ................. 2010-262571

(51) Int. Cl.
*H01L 21/00* (2006.01)
*H01L 33/00* (2010.01)
(52) U.S. Cl. ................. 438/39; 257/E33.023
(58) Field of Classification Search ........... 438/29–32, 438/39–44; 257/E33.023
See application file for complete search history.

(56) References Cited

U.S. PATENT DOCUMENTS

2010/0308437 A1* 12/2010 Okuno et al. ................. 257/615

FOREIGN PATENT DOCUMENTS

JP 2009-203151 A 9/2009

* cited by examiner

*Primary Examiner* — Charles Garber
*Assistant Examiner* — Calvin Choi
(74) *Attorney, Agent, or Firm* — McGinn IP Law Group, PLLC

(57) ABSTRACT

A method for producing a Group III nitride semiconductor light-emitting device includes forming a first stripe-pattern embossment on the top surface of a sapphire substrate, so that first grooves parallel to the x-axis direction (the c-axis direction of the sapphire substrate) are periodically arranged at specific intervals. Subsequently, an insulating film is formed over the entire surface of the first stripe-pattern embossment. Next, a second stripe-pattern embossment is formed so that second grooves, each having a flat bottom surface, are periodically arranged at specific intervals and parallel to the y-axis direction, which is orthogonal to the x-axis direction. A GaN crystal is grown through MOCVD on side surfaces of each second groove of the sapphire substrate, to thereby form, on the sapphire substrate, an m-plane GaN base layer. An LED device structure is formed on the base layer, to thereby produce a light-emitting device.

16 Claims, 4 Drawing Sheets

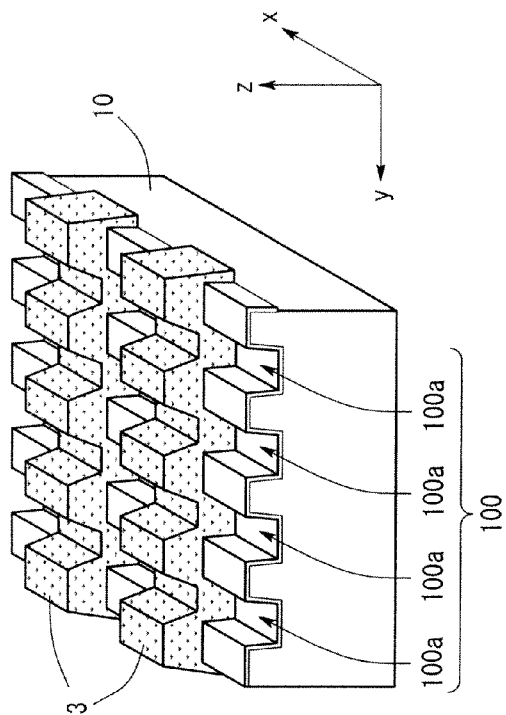
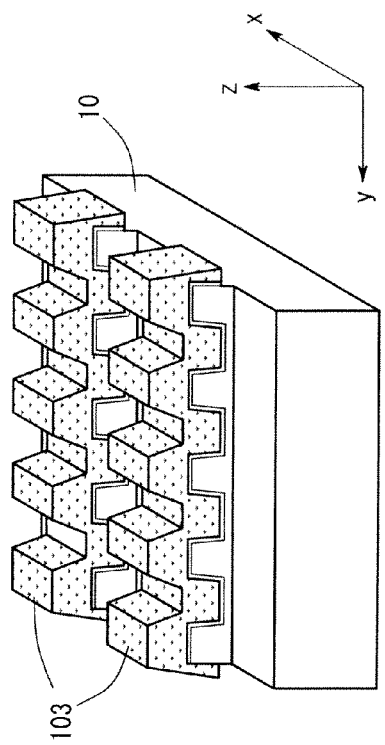
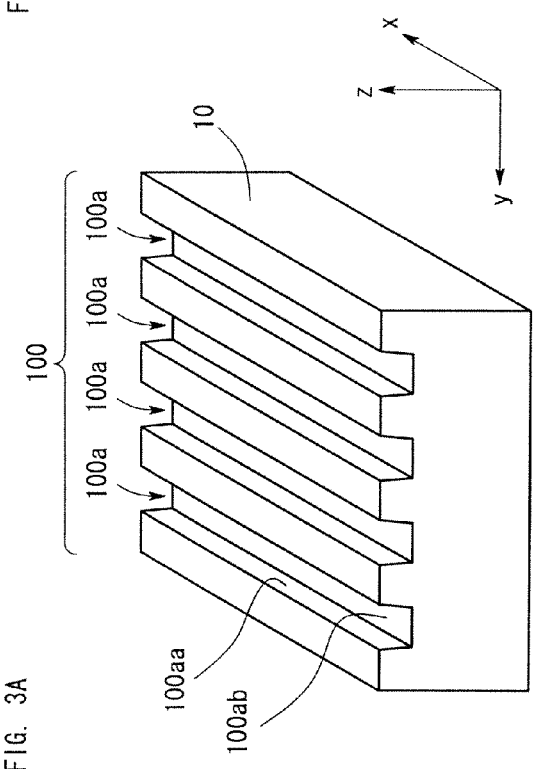
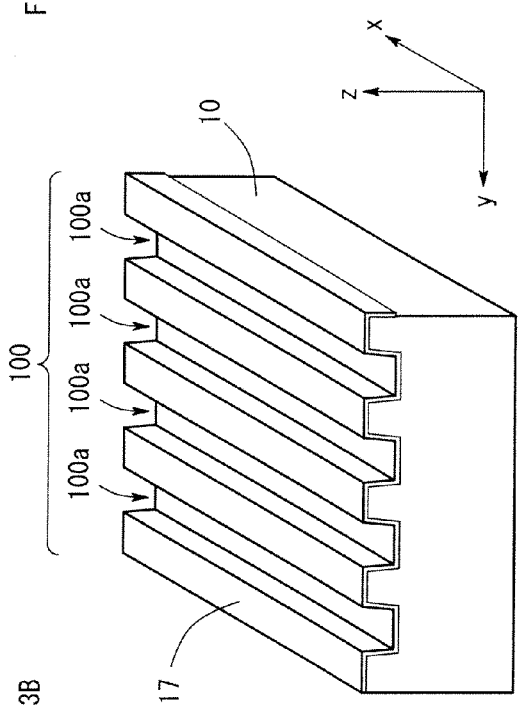

GROUP III NITRIDE SEMICONDUCTOR LIGHT-EMITTING DEVICE

BACKGROUND OF THE INVENTION

1. Field of the Invention

The present invention relates to a method for producing a Group III nitride semiconductor light-emitting device whose main surface is a plane other than c-plane, which method realizes improvement of light extraction performance without causing deterioration of crystallinity.

2. Background Art

Patent document 1 discloses a method for producing a GaN crystal layer whose main surface is a non-polar plane (e.g., m-plane or a-plane) or a semi-polar plane (e.g., (11-22) plane) by growing GaN crystal on side surfaces of dents or mesas of an embossed sapphire substrate. Recently, there has been actively developed a Group III nitride semiconductor light-emitting device whose main surface is such a non-polar or semi-polar plane, since such a device is expected to exhibit improved internal quantum efficiency by virtue of increased recombination of electrons and holes resulting from a small internal electric field. In such an embossed sapphire substrate, desirably, dents or mesas are periodically arranged in a stripe pattern as viewed from above, rather than in a dot pattern as viewed from above, from the viewpoints of reduction of variation in crystal orientation of a GaN crystal layer, and improvement of crystallinity.

Patent Document 1: Japanese Patent Application Laid-Open (kokai) No. 2009-203151

However, when the embossment pattern formed on the sapphire substrate is a stripe pattern, since neither dents nor mesas are provided in the direction of the stripe, light propagated along the stripe on the sapphire substrate does not scatter and may fail to be extracted to the outside.

Meanwhile, when the sapphire substrate has an embossment in which dents or mesas are periodically arranged in a dot pattern as viewed from above, light extraction performance can be improved as compared with the case of a stripe pattern. However, as described above, variation in crystal orientation may be increased, resulting in poor crystallinity.

SUMMARY OF THE INVENTION

In view of the foregoing, an object of the present invention is to provide a method for producing a Group III nitride semiconductor light-emitting device comprising a substrate having a stripe-pattern embossment, and a layered structure formed on the substrate and including a Group III nitride semiconductor layer whose main surface is a non-polar plane or a semi-polar plane, which method realizes improvement of light extraction performance without causing deterioration of the crystallinity of the Group III nitride semiconductor layer.

In a first aspect of the present invention, there is provided a method for producing a Group III nitride semiconductor light-emitting device by forming a stripe-pattern embossment on a surface of a sapphire substrate, and forming a layered structure, on the substrate, which layer structure includes a Group III nitride semiconductor layer whose main surface is a non-polar plane or a semi-polar plane, through growing of a Group III nitride semiconductor crystal on side surfaces of dents or mesas of the embossment, the method comprising:

forming, on a surface of a sapphire substrate, a first stripe-pattern embossment including a plurality of first grooves which are arranged in a stripe pattern as viewed from above and are aligned parallel to a first direction, the first direction being parallel to the main surface of the sapphire substrate;

forming an insulating film over the entire surface of the first stripe-pattern embossment on the surface of the sapphire substrate;

forming, on the insulating film, a stripe-pattern resist mask so that the stripe is aligned in a second direction, the second direction being inclined by a specific angle with respect to the first direction;

forming a second stripe-pattern embossment by dry-etching a portion of the insulating film in a region which is not covered with the resist mask, and then dry-etching the thus-exposed portion of the sapphire substrate until the bottom surface of the thus-etched portion becomes flat; and forming a Group III nitride semiconductor layer whose main surface is a non-polar plane or a semi-polar plane by removing the resist mask, and growing, through MOCVD, a Group III nitride semiconductor crystal on a surface which has been exposed through the forming a second stripe-pattern embossment and which is perpendicular to the main surface of the sapphire substrate so that crystal growth proceeds in a direction perpendicular to the exposed surface.

As used herein, "Group III nitride semiconductor" encompasses a semiconductor represented by the formula $Al_xGa_yIn_zN$ ($x+y+z=1$, $0 \leq x, y, z \leq 1$); such a semiconductor in which a portion of Al, Ga, or In is substituted by another Group 13 element (i.e., B or Tl), or a portion of N is substituted by another Group 15 element (i.e., P, As, Sb, or Bi). Specific examples of the Group III nitride semiconductor include those containing at least Ga, such as GaN, InGaN, AlGaN, and AlGaInN. Generally, Si is used as an n-type impurity, and Mg is used as a p-type impurity.

As used herein, "non-polar plane" or "semi-polar plane" refers to a plane which provides an internal electric field intensity of 10% or less that in the case of c-plane. Examples of the non-polar plane include planes inclined by 90° with respect to c-plane, such as m-plane, a-plane, and (11-24) plane; and examples of the semi-polar plane include planes inclined by about 60° with respect to c-plane, such as (11-22) plane, (20-21) plane, (10-11) plane, and (10-12) plane.

In the forming a second stripe-pattern embossment, the exposed portion of the sapphire substrate is dry-etched until the bottom surface of the thus-etched portion becomes flat. In this case, the bottom surface of the etched portion is not necessarily completely flat, and the flatness of the bottom surface may be of such a level that, in the subsequent forming of the Group III nitride semiconductor layer, crystal growth occurs dominantly on the exposed surface which is perpendicular to the main surface of the sapphire substrate. When a mesa of the sapphire substrate is dry-etched, as etching proceeds, edges of the mesa become rounded, and the height of the mesa decreases, resulting in gentle slope. In the forming a second stripe-pattern embossment, the bottom surface of the etched portion is made flat by utilizing this phenomenon.

The material of the insulating film may be, for example, $SiO_2$, $Si_3N_4$, ZnO, $TiO_2$, or $ZrO_2$. The thickness of the insulating film is preferably 5 Å to 100 Å, from the viewpoint of, for example, easy dry etching of the insulating film in the fourth step.

The angle between the first direction and the second direction is preferably 30° to 150°, most preferably 90°, from the viewpoint of improvement of light extraction performance.

Also, each of side surfaces of the first grooves is preferably inclined by 40° to 80° with respect to the main surface of the sapphire substrate, from the viewpoint of improvement of light extraction performance.

A second aspect of the present invention is drawn to a specific embodiment of the method for producing a Group III nitride semiconductor light-emitting device according to the first aspect of the invention, wherein the first direction is orthogonal to the second direction.

A third aspect of the present invention is drawn to a specific embodiment of a method for producing a Group III nitride semiconductor light-emitting device according to the first or second aspect of the invention, wherein side surfaces of the second grooves are continuously formed along the second direction.

A fourth aspect of the present invention is drawn to a specific embodiment of the method for producing a Group III nitride semiconductor light-emitting device according to any one of the first to third aspects of the invention, wherein the non-polar plane is m-plane, a-plane, or (11-24) plane, and the semi-polar plane is (11-22) plane, (20-21) plane, (10-11) plane, or (10-12) plane.

A fifth aspect of the present invention is drawn to a specific embodiment of the method for producing a Group III nitride semiconductor light-emitting device according to any one of the first to third aspects of the invention, wherein the sapphire substrate has an a-plane main surface, and the first direction is the c-axis direction of the sapphire substrate.

According to the method for producing a Group III nitride semiconductor light-emitting device of the present invention, light extraction performance can be improved without causing deterioration of the crystallinity of a Group III nitride semiconductor layer whose main surface is a non-polar plane or a semi-polar plane.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which:

FIGS. 3A to 3D are sketches showing processes for forming embossments on the top surface of the sapphire substrate 10.

DETAILED DESCRIPTION OF PREFERRED EMBODIMENTS

A specific embodiment of the present invention will next be described with reference to the drawings. However, the present invention is not limited to the embodiment.

Embodiment 1

Figure 1:
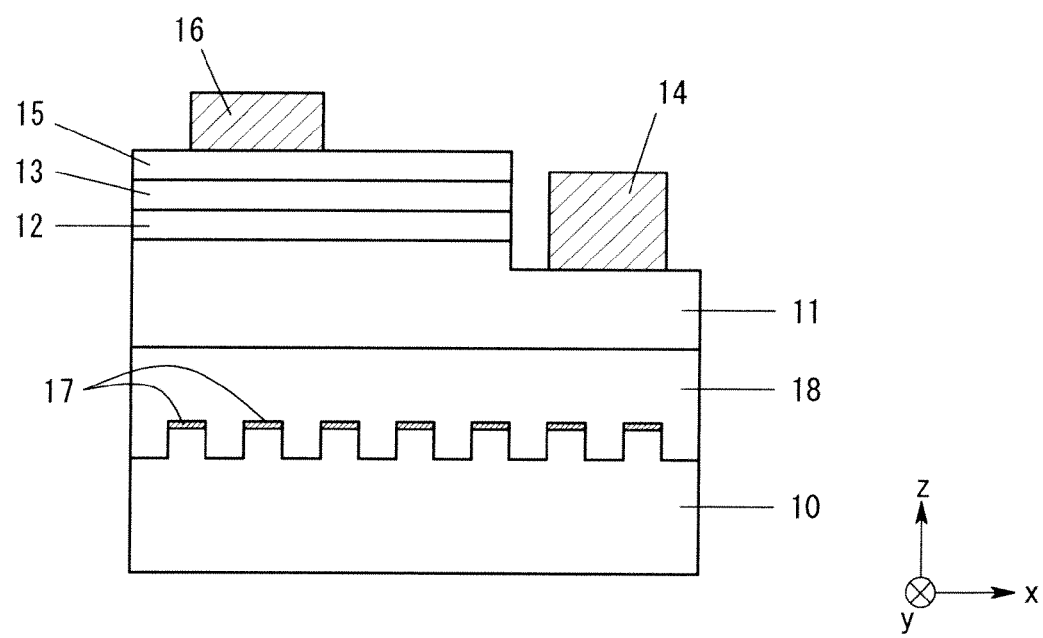
FIG. 1 shows the configuration of a Group III nitride semiconductor light-emitting device according to Embodiment 1.

FIG. 1 shows the configuration of a Group III nitride semiconductor light-emitting device according to Embodiment 1. The Group III nitride semiconductor light-emitting device according to Embodiment 1 includes an embossed sapphire substrate 10 having an a-plane main surface; and a base layer 18, an n-type layer 11, a light-emitting layer 12, and a p-type layer 13, which are sequentially stacked on the embossed surface of the sapphire substrate 10 via a buffer layer (not illustrated), and each of which is formed of a Group III nitride semiconductor layer whose main surface is m-plane. The layered structure of the present invention corresponds to a structure including the n-type layer 11, the light-emitting layer 12, and the p-type layer 13. A portion of the light-emitting layer 12 and a portion of the p-type layer 13 are removed, and the corresponding portion of the n-type layer 11 is exposed. An n-electrode 14 is formed on the exposed portion of the n-type layer 11. An ITO transparent electrode 15 is formed on almost the entire top surface of the p-type layer 13, and a p-electrode 16 is formed on the transparent electrode 15. The Group III nitride semiconductor light-emitting device according to Embodiment 1 is of a face-up type.

Each of the n-type layer 11, the light-emitting layer 12, and the p-type layer 13 may have any of conventionally known structures. For example, the n-type layer 11 has a structure in which a GaN n-type contact layer doped with Si at high concentration and a GaN n-cladding layer are sequentially stacked on the sapphire substrate 10. For example, the light-emitting layer 12 has an MQW structure in which GaN barrier layers and InGaN well layers are alternately stacked. For example, the p-type layer 13 has a structure in which an AlGaN p-cladding layer doped with Mg and a GaN p-contact layer doped with Mg are sequentially stacked on the light-emitting layer 12.

Figure 2A:
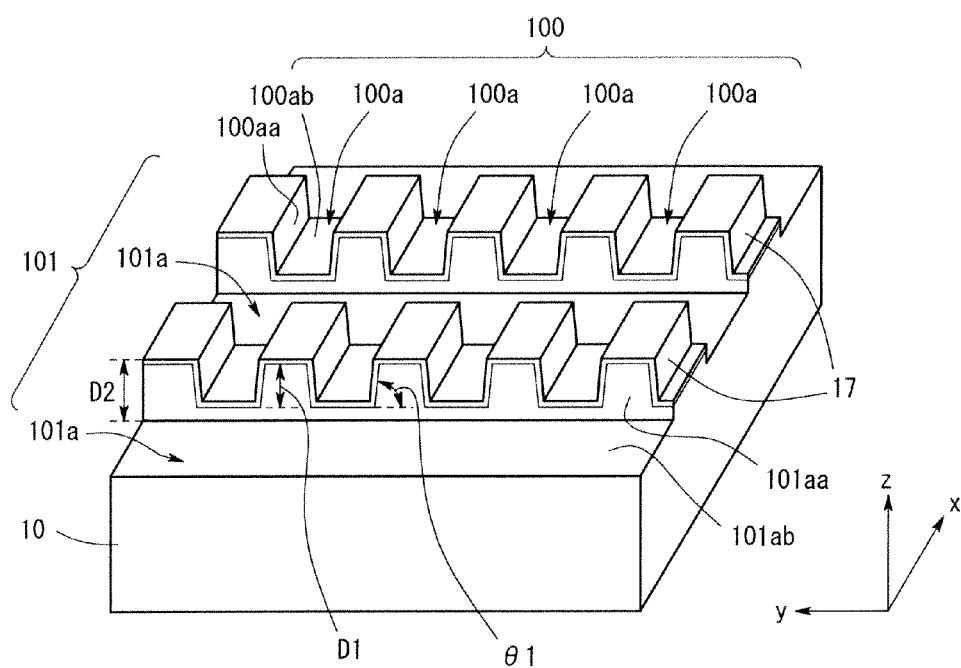
FIGS. 2A and 2B show embossments formed on the top surface of a sapphire substrate 10.
Figure 2B:
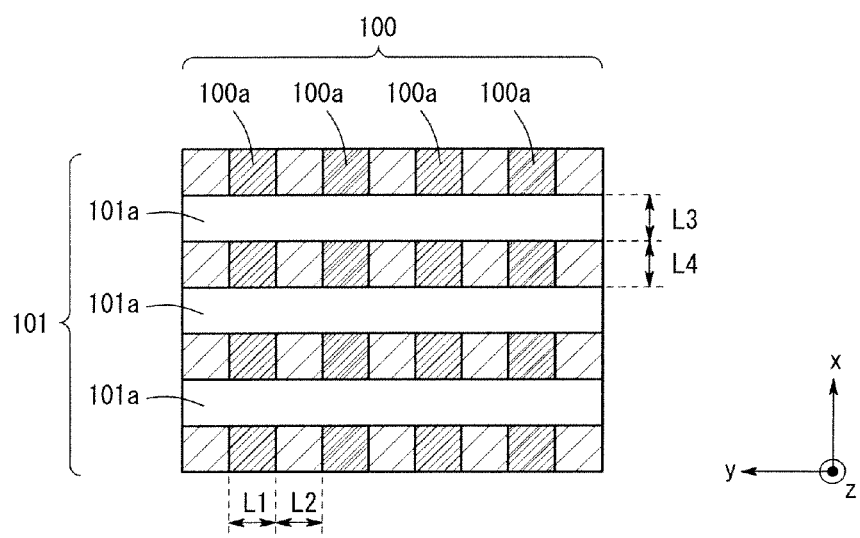

FIG. 2A is a perspective view of an embossment formed on the top surface of the sapphire substrate 10, and FIG. 2B is a top view of the sapphire substrate 10. As shown in FIGS. 2A and 2B, a first stripe-pattern embossment 100 is formed on the top surface of the sapphire substrate 10, and a second stripe-pattern embossment 101 is formed so as to be orthogonal to the first stripe-pattern embossment 100.

The first stripe-pattern embossment 100 includes a plurality of first grooves 100a which are arranged at regular intervals and parallel to a specific direction (i.e., the x-axis direction in FIG. 2, corresponding to the first direction of the present invention). The x-axis direction corresponds to the c-axis direction of the sapphire substrate 10. At side surfaces 100aa of the first grooves 100a, m-plane surfaces of the sapphire substrate 10 are exposed, and, at bottom surfaces 100ab of the first grooves 100a, a-plane surfaces of the sapphire substrate 10 are exposed. Preferably, the width L1 of each first groove 100a is 0.1 µm to 20 µm, and the distance L2 between adjacent first grooves 100a is 0.1 µm to 20 µm. This is because, when the width L1 and the distance L2 fall within the above ranges, light extraction performance can be further improved. More preferably, the width L1 is 0.1 µm to 5 µm, and the distance L2 is 0.1 µm to 5 µm. Preferably, the angle θ1 between each of the side surfaces 100aa of the first grooves 100a and the main surface of the sapphire substrate 10 is 40° to 80°. This is because, when the angle θ1 falls within the above range, light extraction performance can be further improved. More preferably, the angle θ1 is 50° to 70°. Preferably, the depth D1 of each first groove 100a is 0.1 µm to 5 µm. This is because, when the depth D1 falls within the above range, light extraction performance can be further improved. More preferably, the depth D1 is 0.5 µm to 5 µm.

The second stripe-pattern embossment 101 includes a plurality of second grooves 101a which are arranged at regular intervals and parallel to a direction orthogonal to the x-axis direction (i.e., the y-axis direction in FIG. 2, corresponding to the second direction of the present invention). The y-axis direction corresponds to the m-axis direction of the sapphire substrate 10. Bottom surfaces 101*ab* of the second grooves 101*a* are flat, and neither dents nor mesas are provided according to the first stripe-pattern embossment 100. That is concave and convex figure of the first stripe-pattern embossment 100 along y-axis direction is not reflected in the bottom surfaces 101*ab* of the second grooves 101*a*. It is preferable that the side surfaces 101*aa* of the second grooves 101*a* are continuously formed along y-axis direction. Each of the second grooves 101*a* has a rectangular cross section in z-x plane. At side surfaces 101*aa* of the second grooves 101*a*, c-plane surfaces of the sapphire substrate 10 are exposed, and, at the bottom surfaces 101*ab* of the second grooves 101*a*, a-plane surfaces of the sapphire substrate 10 are exposed. Preferably, the width L3 of each second groove 101*a* is 0.1 µm to 20 µm, and the distance L4 between adjacent second grooves 101*a* is 0.1 µm to 20 µm. This is because, when the width L3 and the distance L4 fall within the above ranges, light extraction performance can be further improved. More preferably, the width L3 is 0.1 µm to 5 µm, and the distance L4 is 0.1 µm to 5 µm. No particular limitation is imposed on the depth D2 of each second groove 101*a* (i.e., the depth as measured from the top surface of the sapphire substrate 10 to the bottom surface 101*ab* of the second groove 101*a*), so long as the bottom surface 101*ab* of the second groove 101*a* is flat. However, the depth D2 of each second groove 101*a* is preferably 0.1 times to twice the depth D1 of each first groove 100*a*, from the viewpoint of improvement of light extraction performance attributed to the difference between D2 and D1.

A portion of the top surface of the sapphire substrate 10 (exclusive of the side surfaces 101*aa* and bottom surfaces 101*ab* of the grooves 101*a* of the second stripe-pattern embossment 101) is covered with an $SiO_2$ insulating film 17. The thickness of the insulating film 17 is 5 Å to 100 Å. The insulating film 17 may be formed of, instead of $SiO_2$, $Si_3N_4$, ZnO, $TiO_2$, $ZrO_2$, a similar material.

In the Group III nitride semiconductor light-emitting device according to Embodiment 1, as shown in FIG. 2, the first stripe-pattern embossment 100 provided on the sapphire substrate 10 is divided by the second stripe-pattern embossment 101, whose stripe direction is in the y-axis direction, which is orthogonal to the x-axis direction (i.e., the direction of the stripe of the first stripe-pattern embossment). Therefore, light propagated in the x-axis direction can be reflected and extracted to the outside. Thus, the Group III nitride semiconductor light-emitting device according to Embodiment 1 exhibits improved light extraction performance, as compared with a conventional Group III nitride semiconductor light-emitting device including only the first stripe-pattern embossment 100. In addition, the Group III nitride semiconductor light-emitting device according to Embodiment 1 exhibits improved internal quantum efficiency, since the device has an m-plane main surface.

Next will be described processes for producing the Group III nitride semiconductor light-emitting device according to Embodiment 1 with reference to FIGS. 3 and 4.

Now will be described formation of an embossment on a sapphire substrate 10. Firstly, as shown in FIG. 3A, a first stripe-pattern embossment 100 is formed on the top surface of the sapphire substrate 10 having an a-plane main surface through photolithography and dry etching, so that first grooves 100*a* parallel to the x-axis direction are periodically arranged at specific intervals. At side surfaces 100*aa* of the first grooves 100*a*, m-plane surfaces of the sapphire substrate are exposed, and, at bottom surfaces 100*ab* of the first grooves 100*a*, a-plane surfaces of the sapphire substrate are exposed.

Subsequently, as shown in FIG. 3B, an $SiO_2$ insulating film 17 is formed through vapor deposition over the entire surface of the first stripe-pattern embossment 100 provided on the top surface of the sapphire substrate 10. The insulating film 17 may be formed through, instead of vapor deposition, sputtering, CVD, or a similar technique.

Next, as shown in FIG. 3C, a stripe-pattern photomask 103 is formed through photolithography on the first stripe-pattern embossment 100 provided on the top surface of the sapphire substrate 10, so that openings of the photomask are periodically arranged at specific intervals and parallel to the y-axis direction, which is orthogonal to the x-axis direction.

Thereafter, as shown in FIG. 3D, a portion of the insulating film 17 which is not covered with the photomask 103 is removed through dry etching, and then a portion of the top surface of the sapphire substrate 10 which has been exposed through removal of the insulating film 17 is subjected to dry etching. When a mesa of the sapphire substrate 10 is dry-etched, as etching proceeds, edges of the mesa become rounded, and the height of the mesa gradually decreases, resulting in gentle slope. Therefore, when etching is carried out for a sufficient period of time, the bottom surface of the thus-etched portion can be made flat. Also, etching may be carried out so that the depth of the thus-etched portion is greater than the depth D1 of the first grooves 100*a*. This etching process forms a second stripe-pattern embossment 101 in which second grooves 101*a*, each having a flat bottom surface, are periodically arranged at specific intervals and parallel to the y-axis direction. At side surfaces 101*aa* of the second grooves 101*a*, c-plane surfaces of the sapphire substrate 10 are exposed, and, at bottom surfaces 101*ab* of the second grooves 101*a*, a-plane surfaces of the sapphire substrate 10 are exposed.

Subsequently, the photomask 103 is removed. Thus, the sapphire substrate 10 having the embossment shown in FIG. 2 is formed.

Next will be described processes for producing, from the above-formed sapphire substrate 10 having the embossment thereon, the Group III nitride semiconductor light-emitting device according to Embodiment 1 having an m-plane main surface.

Firstly, an AlN buffer layer (not illustrated) is formed on the sapphire substrate 10 through magnetron sputtering without carrying out thermal cleaning, which is generally performed for recovery from damage to the sapphire substrate 10 due to etching. The buffer layer may be formed through nitridation of a preliminarily formed Al thin film under supply of a nitrogen source such as ammonia. Alternatively, the buffer layer may be formed through, for example, a sputtering technique other than magnetron sputtering, or MOCVD. The buffer layer may be formed of, instead of AlN, GaN, AlGaN, AlInN, AlGaInN, or a similar material. However, the material of the buffer layer is preferably a material having a high compositional proportion of Al, and is most preferably AlN, from the viewpoint of, for example, lattice matching between the buffer layer and the sapphire substrate.

Subsequently, the sapphire substrate 10 having thereon the buffer layer is placed in an MOCVD apparatus and heated in an atmosphere containing hydrogen and ammonia to the crystal growth temperature employed in the subsequent process.

A GaN crystal 104 is grown through MOCVD on side surfaces 101*aa* of each second groove 101*a* via the above-formed buffer layer. The GaN crystal 104 is grown so that the c-axis direction of the sapphire substrate 10 corresponds to the c-axis direction of the GaN crystal. The raw material gases, etc. employed for MOCVD are as follows: ammonia ($NH_3$) as a nitrogen source, trimethylgallium ($Ga(CH_3)_3$) as a Ga source, and $H_2$ or $N_2$ as a carrier gas.

No crystal growth of GaN occurs on a portion of the top surface of the sapphire substrate 10 covered with the insulating film 17 (i.e., exclusive of the side surfaces 101*aa* and bottom surfaces 101*ab* of the second grooves 101*a*). Thus, the thickness of the AlN buffer layer and the growth temperature of the GaN crystal 104 are adjusted so that the GaN crystal 104 is not grown on each bottom surface 101*ab*, and so that growth of the GaN crystal on side surfaces 101*aa* of each second groove 101*a* proceeds dominantly in the c-axis direction. For example, the thickness of the AlN buffer layer may be adjusted so as to be smaller than the minimum thickness of an AlN buffer layer which is generally formed between the sapphire substrate and a flat GaN crystal when the GaN crystal is epitaxially grown in the c-axis direction (i.e., the direction perpendicular to the main surface of the sapphire substrate), and the growth temperature of the GaN crystal 104 may be adjusted so as to be lower than a temperature at which a GaN crystal is generally epitaxially grown in the c-axis direction (i.e., the direction perpendicular to the main surface of the sapphire substrate). Such a general AlN buffer layer is formed through sputtering for 40 seconds, and has a minimum thickness of 150 Å to 200 Å. Generally, when a GaN crystal is epitaxially grown in the c-axis direction (i.e., the direction perpendicular to the main surface of the sapphire substrate), the growth temperature is higher than 1,100° C. Therefore, when the thickness of the AlN buffer layer is adjusted to 150 Å or less, and the growth temperature of GaN is adjusted to 1,100° C. or lower, growth of the GaN crystal 104 on each bottom surface 101*ab* can be prevented, and growth of the GaN crystal on side surfaces 101*aa* of each second groove 101*a* can be allowed to proceed dominantly in the c-axis direction.

Figure 4A:
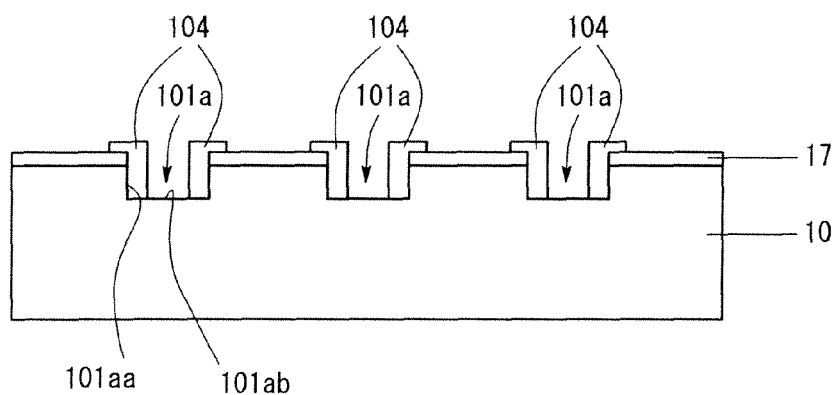
FIGS. 4A to 4C are sketches showing processes for producing the Group III nitride semiconductor light-emitting device according to Embodiment 1.
Figure 4B:
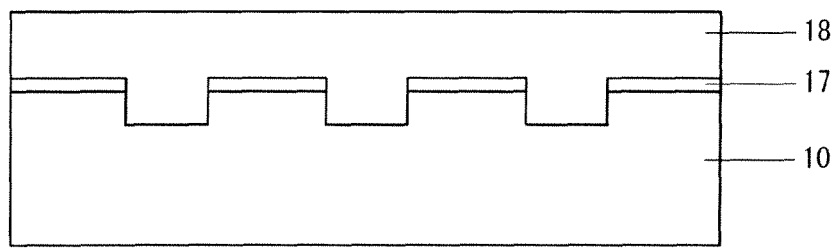

When the GaN crystal 104 is grown as described above, rapid growth of the GaN crystal 104 occurs in the c-axis direction and −c-direction; i.e., in a direction toward the center of each second groove 101*a* and horizontal to the sapphire substrate 10, and gradual growth of the GaN crystal 104 occurs in a direction perpendicular to the sapphire substrate 10 (FIG. 4A). As crystal growth further proceeds, each second groove 101*a* is filled with the GaN crystal 104, and the top surface of the sapphire substrate 10 is gradually covered with the GaN crystal through growth thereof in directions horizontal to the sapphire substrate 10 (i.e., both −c-direction and +c-direction). Finally, the flat GaN crystal (base layer 18) is formed on the sapphire substrate (FIG. 4B). The base layer 18 formed of the GaN crystal has an m-plane main surface, since the sapphire substrate 10 has an a-plane main surface, and side surfaces 101*aa* of each second groove 101*a* are c-plane. This is attributed to, for example, the difference in lattice constant between GaN and sapphire.

As described above, the base layer 18 is formed of the GaN crystal grown only on the side surfaces 101*aa* of the second grooves 101*a* (i.e., c-plane surfaces of the sapphire substrate). Therefore, the base layer 18 exhibits reduced variation in crystal orientation of the GaN crystal, and improved GaN crystallinity.

Figure 4C:
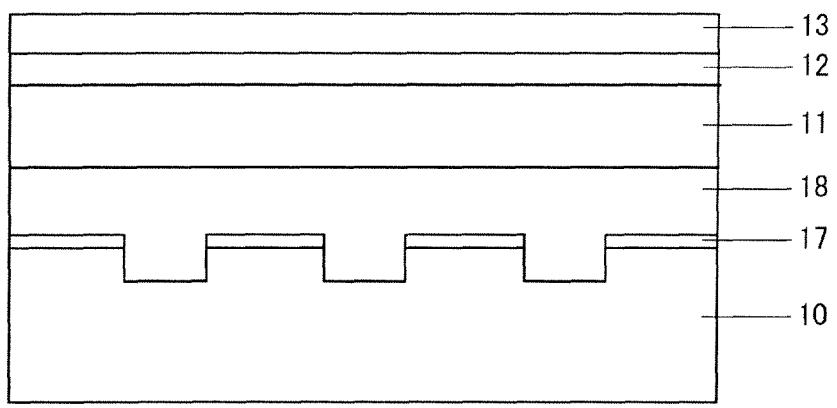

Subsequently, an n-type layer 11, a light-emitting layer 12, and a p-type layer 13 are sequentially deposited on the base layer 18 by MOCVD (FIG. 4C). The raw material gases, etc. employed for MOCVD are as follows: a nitrogen source and a Ga source (the same as in the case of formation of the base layer 18), trimethylindium ($In(CH_3)_3$) as an In source, trimethylaluminum ($Al(CH_3)_3$) as an Al source, silane ($SiH_4$) as an n-type doping gas, cyclopentadienylmagnesium ($Mg(C_5H_5)_2$) as a p-type doping gas, and $H_2$ or $N_2$ as a carrier gas.

Next, a portion of the p-type layer 13 and a portion of the light-emitting layer 12 are removed through dry etching, to thereby expose the corresponding portion of the surface of the n-type layer 11. A transparent electrode 15 is formed on almost the entire top surface of the p-type layer 13; an n-electrode 14 is formed on the thus-exposed portion of the surface of the n-type layer 11; and a p-electrode 16 is formed on the transparent electrode 15. Thus, the Group III nitride semiconductor light-emitting device according to Embodiment 1 shown in FIG. 1 is produced.

As described above, for production of the Group III nitride semiconductor light-emitting device having an m-plane main surface, the sapphire substrate 10 having the embossment thereon (formed as shown in FIG. 3) is employed, and GaN is grown on side surfaces of dents or mesas of the embossment. In the sapphire substrate 10, the first stripe-pattern embossment 100 is divided by the second stripe-pattern embossment 101, and a difference in level is provided between these embossments in the x-axis direction. Therefore, light propagated in the x-axis direction can be reflected and extracted to the outside. The top surface of the sapphire substrate 10 is covered with the insulating film 17, and only the side surfaces 101*aa* and bottom surfaces 101*ab* of the second grooves 101*a* are exposed. Since all the side surfaces 101*aa* are c-plane surfaces of the sapphire substrate, when the base layer 18 is formed through crystal growth of GaN on the side surfaces 101*aa*, the base layer 18 exhibits uniform crystal orientation and thus improved crystal quality.

In Embodiment 1, the method of the present invention is applied to production of the Group III nitride semiconductor light-emitting device having an m-plane main surface. However, the present invention is not limited thereto, and may be applied to production of a Group III nitride semiconductor light-emitting device having a specific main surface. Particularly, the present invention is suitably applied to production of a Group III nitride semiconductor light-emitting device whose main surface is, for example, a-plane or (11-22) plane; i.e., a plane which provides an internal electric field intensity of 10% or less that in the case of c-plane.

In Embodiment 1, the stripe direction of the first stripe-pattern embossment 100 (i.e., the first direction) is orthogonal to the stripe direction of the second stripe-pattern embossment 101 (i.e., the second direction). However, the angle between the first and second directions may be appropriately determined in consideration of the crystal orientation of the main surface of a Group III nitride semiconductor layer to be formed; i.e., in consideration of both the crystal orientation of the main surface of the sapphire substrate and the crystal orientation of the side surfaces 101*aa* of the second grooves 101*a*. Preferably, the angle between the first and second directions is 30° to 150°, from the viewpoint of improvement of light extraction performance.

The Group III nitride semiconductor light-emitting device according to Embodiment 1 is of a face-up type. However, the present invention is not limited thereto, and may be applied to a flip-chip type.

The Group III nitride semiconductor light-emitting device of the present invention can be employed in, for example, an illumination apparatus.

What is claimed is:

1. A method for producing a Group III nitride semiconductor light-emitting device by forming a stripe-pattern embossment on a surface of a sapphire substrate, and forming a layered structure, on the substrate, which layer structure includes a Group III nitride semiconductor layer whose main surface is a non-polar plane or a semi-polar plane, through growing of a Group III nitride semiconductor crystal on side surfaces of dents or mesas of the embossment, the method comprising:

forming, on a surface of a sapphire substrate, a first stripe-pattern embossment including a plurality of first grooves which are arranged in a stripe pattern as viewed from above and are aligned parallel to a first direction, the first direction being parallel to the main surface of the sapphire substrate;

forming an insulating film over the entire surface of the first stripe-pattern embossment on the surface of the sapphire substrate;

forming, on the insulating film, a stripe-pattern resist mask so that the stripe is aligned in a second direction, the second direction being inclined by a specific angle with respect to the first direction;

forming a second stripe-pattern embossment by dry-etching a portion of the insulating film in a region which is not covered with the resist mask, and then dry-etching the thus-exposed portion of the sapphire substrate until the bottom surface of the thus-etched portion becomes flat; and forming a Group III nitride semiconductor layer whose main surface is a non-polar plane or a semi-polar plane by removing the resist mask, and growing, through MOCVD, a Group III nitride semiconductor crystal on a surface which has been exposed through the forming the second stripe-pattern embossment and which is perpendicular to the main surface of the sapphire substrate so that crystal growth proceeds in a direction perpendicular to the exposed surface.

2. A method for producing a Group III nitride semiconductor light-emitting device according to claim 1, wherein the first direction is orthogonal to the second direction.

3. A method for producing a Group III nitride semiconductor light-emitting device according to claim 1, wherein side surfaces of the second grooves are continuously formed along the second direction.

4. A method for producing a Group III nitride semiconductor light-emitting device according to claim 2, wherein side surfaces of the second grooves are continuously formed along the second direction.

5. A method for producing a Group III nitride semiconductor light-emitting device according to claim 1, wherein the non-polar plane is m-plane, a-plane, or (11-24) plane, and the semi-polar plane is (11-22) plane, (20-21) plane, (10-11) plane, or (10-12) plane.

6. A method for producing a Group III nitride semiconductor light-emitting device according to claim 2, wherein the non-polar plane is m-plane, a-plane, or (11-24) plane, and the semi-polar plane is (11-22) plane, (20-21) plane, (10-11) plane, or (10-12) plane.

7. A method for producing a Group III nitride semiconductor light-emitting device according to claim 3, wherein the non-polar plane is m-plane, a-plane, or (11-24) plane, and the semi-polar plane is (11-22) plane, (20-21) plane, (10-11) plane, or (10-12) plane.

8. A method for producing a Group III nitride semiconductor light-emitting device according to claim 4, wherein the non-polar plane is m-plane, a-plane, or (11-24) plane, and the semi-polar plane is (11-22) plane, (20-21) plane, (10-11) plane, or (10-12) plane.

9. A method for producing a Group III nitride semiconductor light-emitting device according to claim 1, wherein the sapphire substrate has an a-plane main surface, and the first direction is the c-axis direction of the sapphire substrate.

10. A method for producing a Group III nitride semiconductor light-emitting device according to claim 2, wherein the sapphire substrate has an a-plane main surface, and the first direction is the c-axis direction of the sapphire substrate.

11. A method for producing a Group III nitride semiconductor light-emitting device according to claim 3, wherein the sapphire substrate has an a-plane main surface, and the first direction is the c-axis direction of the sapphire substrate.

12. A method for producing a Group III nitride semiconductor light-emitting device according to claim 4, wherein the sapphire substrate has an a-plane main surface, and the first direction is the c-axis direction of the sapphire substrate.

13. A method for producing a Group III nitride semiconductor light-emitting device according to claim 5, wherein the sapphire substrate has an a-plane main surface, and the first direction is the c-axis direction of the sapphire substrate.

14. A method for producing a Group III nitride semiconductor light-emitting device according to claim 6, wherein the sapphire substrate has an a-plane main surface, and the first direction is the c-axis direction of the sapphire substrate.

15. A method for producing a Group III nitride semiconductor light-emitting device according to claim 7, wherein the sapphire substrate has an a-plane main surface, and the first direction is the c-axis direction of the sapphire substrate.

16. A method for producing a Group III nitride semiconductor light-emitting device according to claim 8, wherein the sapphire substrate has an a-plane main surface, and the first direction is the c-axis direction of the sapphire substrate.

* * * * *